(12) United States Patent
Kitamura et al.

(10) Patent No.: US 6,768,247 B2
(45) Date of Patent: Jul. 27, 2004

(54) VIBRATING REED, VIBRATOR, OSCILLATOR AND ELECTRONIC DEVICE

(75) Inventors: Fumitaka Kitamura, Nagano-ken (JP); Hideo Tanaya, Nagano-ken (JP); Junichiro Sakata, Nagano-ken (JP)

(73) Assignee: Seiko Epson Corporation (JP)

( * ) Notice: Subject to any disclaimer, the term of this patent is extended or adjusted under 35 U.S.C. 154(b) by 14 days.

(21) Appl. No.: 10/087,664

(22) Filed: Mar. 1, 2002

(65) Prior Publication Data

US 2002/0121175 A1 Sep. 5, 2002

(30) Foreign Application Priority Data

Mar. 2, 2001 (JP) .......................................... 2001-059048

(51) Int. Cl.$^7$ ............................................. H01L 41/08

(52) U.S. Cl. ........................................................ 310/370

(58) Field of Search ................................. 310/330, 370, 310/340

(56) References Cited

U.S. PATENT DOCUMENTS

| | | | | |
|---|---|---|---|---|
| 4,370,583 A | * | 1/1983 | Ljung | 310/331 |
| 4,384,232 A | * | 5/1983 | Debely | 310/370 |
| 4,714,847 A | * | 12/1987 | Harnden et al. | 310/332 |
| 5,719,460 A | * | 2/1998 | Watarai et al. | 310/316.01 |
| 5,987,987 A | * | 11/1999 | Watarai | 73/504.16 |
| 6,141,844 A | * | 11/2000 | Miyagawa et al. | 29/25.35 |
| 6,541,897 B2 | * | 4/2003 | Endoh | 310/344 |
| 6,587,009 B2 | * | 7/2003 | Kitamura et al. | 331/158 |

\* cited by examiner

*Primary Examiner*—Mark Budd
(74) *Attorney, Agent, or Firm*—Harness, Dickey & Pierce, P.L.C.

(57) ABSTRACT

A vibrating reed is provided which includes a base; and a vibration arm section formed so as to protrude from this base, a grooved portion is formed in one of the obverse surface and the rear surface of the vibration arm section, and a groove electrode portion and a side electrode portion is formed in the grooved portion and the side portion of the vibration arm section, respectively, wherein a short-circuit prevention section is formed between the groove electrode portion and the side electrode portion and thus vibration failure is made unlikely to occur while minimizing the CI value.

18 Claims, 9 Drawing Sheets

PRIOR ART

PRIOR ART

VIBRATING REED, VIBRATOR, OSCILLATOR AND ELECTRONIC DEVICE

FIELD OF THE INVENTION

The present invention relates to a vibrating reed formed of, for example, a crystal, a vibrator having the vibrating reed, an oscillator having the vibrator, and an electronic device having the vibrator.

DESCRIPTION OF THE RELATED ART

Conventionally, a tuning-fork-type crystal vibrating reed is constructed as shown in, for example, FIG. 11.

More specifically, a tuning-fork-type crystal vibrating reed 10 comprises a base 11, and two vibration arm sections 12 and 13 formed so as to protrude from the base 11. In these two vibration arm sections 12 and 13, as shown in FIG. 12, grooves 12a and 13a are formed on the obverse surfaces and the rear surfaces thereof.

FIG. 12 is an enlarged sectional view along the A—A' line in FIG. 11. As shown in FIG. 12, the vibration arm sections 12 and 13 are formed in such a manner that their cross sections are formed in nearly an H shape with the grooves 12a and 13a.

Furthermore, as shown in FIG. 12, such grooves 12a and 13a are formed with groove excitation electrodes 12b and 13b for causing these vibration arm sections 12 and 13 to vibrate, respectively.

Furthermore, as shown in FIG. 12, side excitation electrodes 12c and 13c are also formed on the sides of the vibration arm sections 12 and 13, respectively.

The groove excitation electrodes 12b and 13b and the side excitation electrodes 12c and 13c are arranged with a fixed spacing therebetween, as shown in FIG. 12, so that these are not short-circuited with each other.

That is, when a voltage is applied to the groove excitation electrodes 12b and 13b and the side excitation electrodes 12c and 13c, an electric field is generated inside the vibration arm sections 12 and 13 at the portions which are held between these electrodes, and vibration starts.

Therefore, when the groove excitation electrodes 12b and 13b and the side excitation electrodes 12c and 13c are short-circuited, it becomes difficult for an electric field to be generated inside the vibration arm sections 12 and 13, causing the tuning-fork-type crystal vibrating reed 10 to malfunction.

The larger the widths (in the horizontal direction in FIG. 12) of the grooves 12a and 13a of such a tuning-fork-type crystal vibrating reed 10 are, the better the characteristics such as CI value (crystal impedance) becomes. For this reason, the widths of the grooves 12a and 13a are formed as large as possible.

As a consequence, the spacing between the groove excitation electrodes 12b and 13b and the side excitation electrodes 12c and 13c is small. As a result, even if a small amount of dust falls between the groove excitation electrodes 12b and 13b, and the side excitation electrodes 12c and 13c, a short-circuit is likely to occur, and the vibration of the vibration arm sections 12 and 13 may malfunction.

Meanwhile, in order to prevent a short-circuit which causes such a vibration malfunction, if an insulation film is arranged in an electrode section, the CI value (crystal impedance or equivalent series resistance) increases, and a problem arises in that the performance of the entire vibrating reed is deteriorated.

SUMMARY OF THE INVENTION

An object of the present invention is to provide a vibrating reed capable of making it difficult for a vibration failure to occur while minimizing the CI value, a vibrator having the vibrating reed, an oscillator comprising the vibrator, and an electronic device comprising the vibrator.

According to the present invention, preferably, vibrating reeds from (1) to (7) below are provided.

(1) A vibrating reed comprising: a base; and a vibration arm section formed so as to protrude from this base, a grooved portion being formed in one of a first or obverse surface and a second or rear surface of the vibration arm section, and a groove electrode portion and a side electrode portion being formed in the grooved portion and the side portion of the vibration arm section, respectively, wherein a short-circuit prevention section is formed between the groove electrode portion and the side electrode portion.

(2) A vibrating reed, wherein the groove electrode portion and the side electrode portion are excitation electrodes.

(3) A vibrating reed, wherein the short-circuit prevention section is formed of an insulation film.

(4) A vibrating reed, wherein the insulation film is formed in an etching step.

(5) A vibrating reed, wherein a cut section is formed in the base.

(6) A vibrating reed, wherein the base is provided with a fixation area for fixing this vibrating reed, and the cut section is provided in the base between the fixation area and the vibration arm section.

(7) A vibrating reed, wherein the vibrating reed is a tuning-fork-type vibrating reed formed from a crystal which oscillates at approximately 30 kHz to at approximately 40 kHz.

DESCRIPTION OF THE EMBODIMENTS

Figure 1:
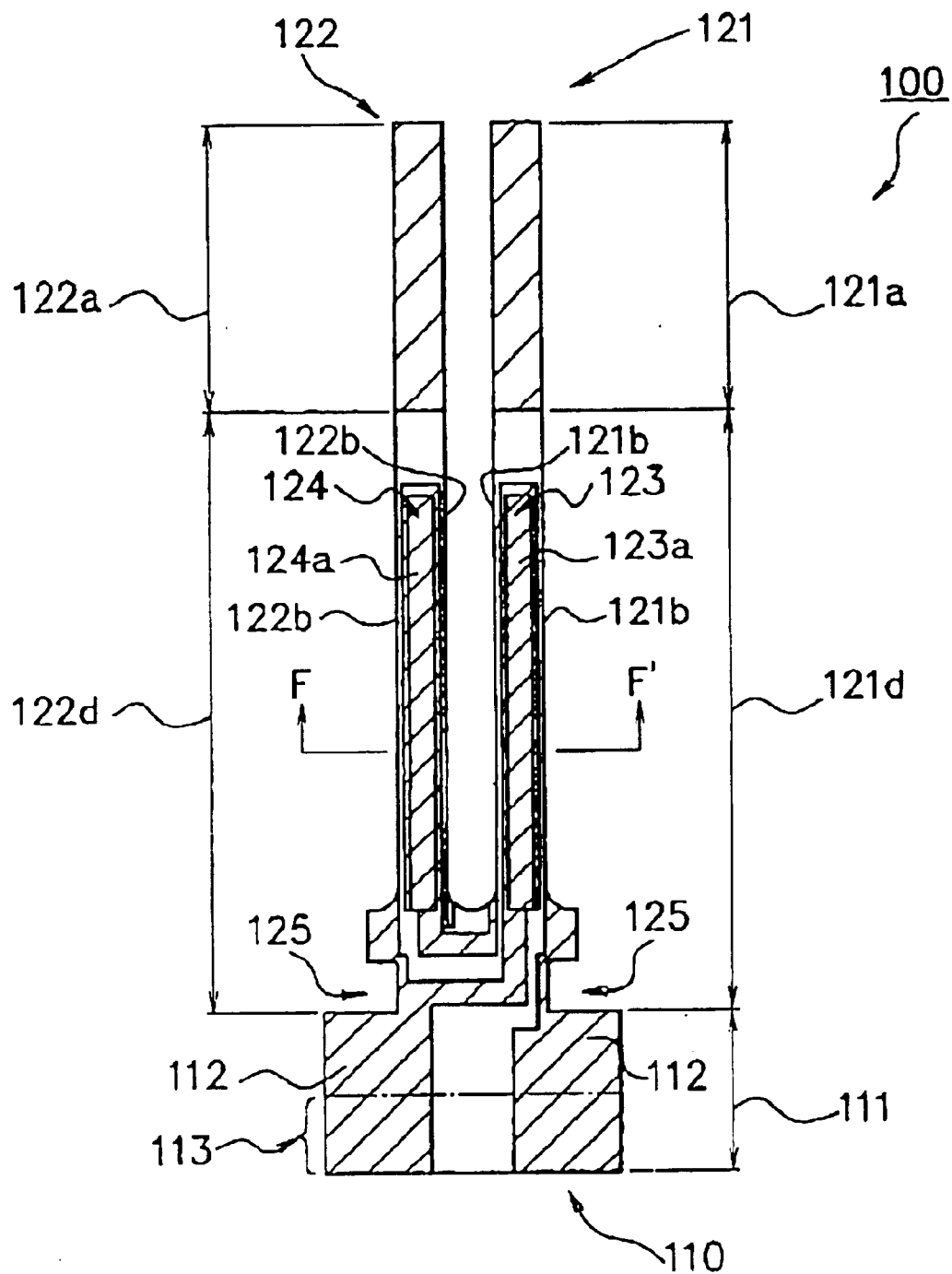
FIG. 1 is a schematic view of a tuning-fork-type crystal vibrating reed according to a first embodiment of the present invention.

Regarding each aspect of the invention of the above-described (1) to (7), preferably, the following embodiments are provided. However, the present invention is not limited to these embodiments.

A vibrator having a vibrating reed housed in a package, the vibrating reed comprising: a base; and a vibration arm section formed so as to protrude from this base, a grooved portion being formed in one of a first or obverse surface and a second or rear surface of the vibration arm section, and a groove electrode portion and a side electrode portion being formed in the grooved portion and the side portion of the vibration arm section, respectively, wherein a short-circuit prevention section is formed between the groove electrode portion and the side electrode portion of the vibrating reed.

A vibrator, wherein the groove electrode portion and the side electrode portion of the vibrating reed are excitation electrodes.

A vibrator, wherein the short-circuit prevention section of the vibrating reed is formed by an insulation film.

A vibrator, wherein the insulation film of the vibrating reed is formed in an etching step.

A vibrator, wherein a cut section is formed in the base of the vibrating reed.

A vibrator, wherein a fixation area for fixing this vibrating reed is provided in the cut section of the vibrating reed, and the cut section is provided in the base between the fixation area and the vibration arm section.

A vibrator, wherein the vibrating reed formed by a crystal which oscillates at approximately 30 kHz to at approximately 40 kHz is a tuning-fork-type vibrating reed.

A vibrator, wherein the package is formed in a box shape.

A vibrator, wherein the package is formed in a commonly-called cylinder type.

An oscillator having a vibrating reed and an integrated circuit housed in a package, the vibrating reed comprising: a base; and a vibration arm section formed so as to protrude from this base, a grooved portion being formed in one of a first or obverse surface and a second orrear surface of the vibration arm section, and a groove electrode portion and a side electrode portion being formed in the grooved portion and the side portion of the vibration arm section, respectively, wherein a short-circuit prevention section is formed between the groove electrode portion and the side electrode portion of the vibrating reed.

An electronic device using a vibrator which is connected to a control section, the vibrator having a vibrating reed housed in a package, the vibrating reed comprising: a base; and a vibration arm section formed so as to protrude from this base, a grooved portion being formed in one of a first or obverse surface and a second or rear surface of the vibration arm section, and a groove electrode portion and a side electrode portion being formed in the grooved portion and the side portion of the vibration arm section, respectively, wherein a short-circuit prevention section is formed between the groove electrode portion and the side electrode portion of the vibrating reed.

A method of manufacturing a vibrating reed comprising a base; and a vibration arm section formed so as to protrude from this base, a grooved portion being formed in one of a first or obverse surface and a second or rear surface of the vibration arm section, and a groove electrode portion and a side electrode portion being formed in the grooved portion and the side portion of the vibration arm section, respectively, the method comprising a step of forming a short-circuit prevention section between the groove electrode portion and the side electrode portion, this step including at least a step of forming an insulation film in the vibration arm section so that the insulation film formed in the side portion and the grooved portion is thinner in the film thickness than the insulation film formed on the obverse surface of the vibration arm section, and a step of removing the insulation film formed in the side portion and the grooved portion.

The preferred embodiments of the present invention will be described below in detail with reference to the attached drawings.

Since the embodiments to be described below are preferred specific examples of the present invention, various preferable technical limitations are imposed thereon. However, the scope of the present invention is not limited to these embodiments.

FIG. 1 shows a tuning-fork-type crystal vibrating reed 100 which is a vibrating reed according to a first embodiment of the present invention.

The tuning-fork-type crystal vibrating reed 100 is formed in such a manner that a single quartz crystal is cut out so as to be formed as, for example, a commonly-called Z-plate crystal. Furthermore, since the tuning-fork-type crystal vibrating reed 100 shown in FIG. 1 is a vibrating reed which generates a signal at, for example, 32.768 kHz, it becomes a very small vibrating reed.

Such a tuning-fork-type crystal vibrating reed 100, as shown in FIG. 1, has a pad section 110 which is a base. Two tuning-fork arms 121 and 122, which are vibration arm sections, are arranged in such a manner so as to protrude upward in the figure from the pad section 110.

Figure 2:
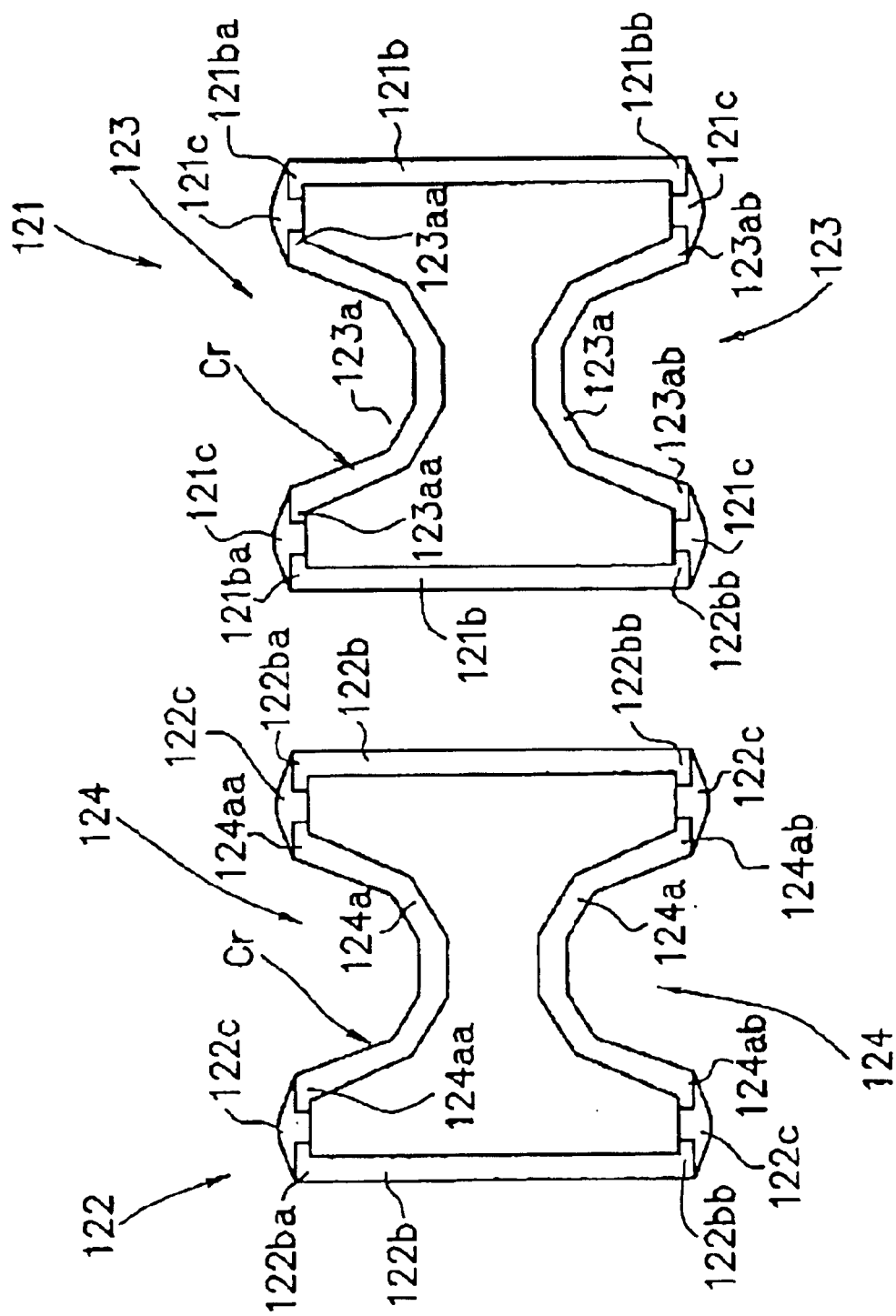
FIG. 2 is a sectional view along the line F–F' in FIG. 1.

Furthermore, groove sections 123 and 124 are formed on the first or obverse surfaces and the second or rear surfaces of the tuning-fork arms 121 and 122, as shown in FIG. 1. Similarly, since the groove sections 123 and 124 are also formed on the rear surfaces of the tuning-fork arms 121 and 122 (not shown in FIG. 1), these are formed into nearly an H shape in the F–F' sectional view of FIG. 1, as shown in FIG. 2.

In the tuning-fork arms 121 and 122, electrodes are formed, as shown in FIG. 1. Specifically, the portions, indicated with oblique lines, of the tip portions of the tuning-fork arms 121 and 122 are frequency adjustment electrode sections 121a and 122a for adjusting a frequency.

The frequency adjustment electrode sections 121a and 122a are formed by forming Au (gold) on Cr (chromium).

Groove electrode sections 123a and 124a are formed in the groove sections 123 and 124, respectively. As shown in FIG. 2, the groove electrode sections 123a and 124a are formed within the groove sections 123 and 124 formed on both the obverse surfaces and the rear surfaces of the tuning-fork arms 121 and 122, respectively. The groove electrode sections 123a and 124a are made from Cr. The groove electrode sections 123a and 124a act as excitation electrodes for vibrating the tuning-fork arms 121 and 122, respectively.

Meanwhile, on the right side and the left side of the tuning-fork arms 121 and 122 of FIG. 1, side electrode sections 121*b* and 122*b* are formed. Specifically, as shown in FIG. 2, these are arranged with a fixed spacing with the groove electrode sections 123*a* and 124*a*.

This is for the purpose of avoiding a mutual short-circuit thereof when a voltage is applied to the side electrode sections 121*b* and 122*b* and the groove electrode sections 123*a* and 124*a*.

The side electrode sections 121*b* and 122*b* are made from Cr similarly to the groove electrode sections 123*a* and 124*a*, and act as excitation electrodes.

More specifically, when a voltage is applied to the side electrode sections 121*b* and 122*b* and the groove electrode sections 123*a* and 124*a* of the tuning-fork arms 121 and 122, shown in FIG. 2, an electric field is efficiently generated inside the tuning-fork arms 121 and 122, and these vibrate efficiently.

Therefore, in the tuning-fork arms 121 and 122 having the groove electrode sections 123*a* and 124*a* in this manner, the vibration loss is small.

The groove electrode sections 123*a* and 124*a* and the side electrode sections 121*b* and 122*b* are arranged with a fixed spacing therebetween in the manner described above. If dust falls in this spacing, the groove electrode sections 123*a* and 124*a* and the side electrode sections 121*b* and 122*b* are short-circuited with each other, and thus the vibration of the tuning-fork arms 121 and 122 is hindered.

For this reason, in this embodiment, insulation films 121*c* and 122*c*, which are short-circuit prevention sections, are arranged, as shown in FIG. 2. The insulation films 121*c* and 122*c* are formed from, for example, SiO$_2$.

However, additionally, the insulation films 121*c* and 122*c* may be an oxide such as alumina, a nitride such as silicon nitride, or an organic film.

Such insulation films 121*c* and 122*c* are arranged in such a manner that, as shown in FIG. 2, the upper end portions 121*ba* and 122*ba* and the lower end portions 121*bb* and 122*bb* of the side electrode sections 121*b* and 122*b* are connected to the upper end portions 123*aa* and 124*aa* and the lower end portions 123*ab* and 124*ab* of the groove electrode sections 123*a* and 124*a*, respectively.

Therefore, the insulation films 121*c* and 122*c* are not arranged in the groove electrode sections 123*a* and 124*a* arranged inside the groove sections 123 and 124 of the tuning-fork arms 121 and 122, respectively.

Similarly, the insulation films 121*c* and 122*c* are also arranged in the side electrode sections 121*b* and 122*b* arranged on the right and left sides in FIG. 2 of the tuning-fork arms 121 and 122, respectively.

As a consequence, since the insulation films 121*c* and 122*c* are not arranged in the groove electrode sections 123*a* and 124*a* inside the groove sections 123 and 124 and the side electrode sections 121*b* and 122*b* on the side of the tuning-fork arms 121 and 122, which function as excitation electrodes, even if a voltage is applied to these electrodes and the tuning-fork arms 121 and 122 vibrate, the vibrating reed becomes a tuning-fork-type crystal vibrating reed 100 having a low CI value.

Furthermore, since the insulation films 121*c* and 122*c* are formed between the side electrode sections 121*b* and 122*b* and the groove electrode sections 123*a* and 124*a*, respectively, even if, for example, dust falls therebetween, these will not be short-circuited.

In addition, the insulation films 121*c* and 122*c* are arranged in such a manner that the end portions thereof cover the upper end portions 121*ba* and 122*ba* and the lower end portions 121*bb* and 122*bb* of the side electrode sections 121*b* and 122*b* and the upper end portions 123*aa* and 124*aa* and the lower end portions 123*ab* and 124*ab* of the groove electrode sections 123*a* and 124*a*.

As a consequence, the contact between the insulation films 121*c* and 122*c* is increased, and the insulation films 121*c* and 122*c* are strongly fixed to the tuning-fork arms 121 and 122, respectively.

Furthermore, as shown in FIG. 1, in the insulation film formation sections 121*d* and 122*d* forming the insulation films 121*c* and 122*c*, only Cr is formed as the groove electrode sections 123*a* and 124*a* and the side electrode sections 121*b* and 122*b* in the manner described above. The reason why Au is not particularly formed on Cr is that, when the insulation films 121*c* and 122*c* used in this embodiment are made of SiO$_2$, the contact of Cr with Au is poor.

For this reason, the insulation films 121*c* and 122*c* have an improved contact with the groove electrode sections 123*a* and 124*a* and the side electrode sections 121*b* and 122*b* made from Cr, respectively.

As shown in FIG. 1, in the pad section 111, a pad electrode section 112 made from Cr and Au is formed.

As described above, in the frequency adjustment electrode sections 121*a* and 122*a* and the pad section 111 of the tuning-fork-type crystal vibrating reed 100 of this embodiment, the insulation films 121*c* and 122*c* are not formed. This is because these portions are portions for making an external electrical contact.

The entire pad section 110 of the tuning-fork-type crystal vibrating reed 100 is formed in nearly a plate shape, as shown in FIG. 1.

In this pad section 110, as shown in FIG. 1, two cut sections 125 are provided on both sides of the pad section 110.

Since the cut sections 125 are positioned below the lower end portions of the groove sections 123 and 124 of the tuning-fork arms 121 and 122 as shown in FIG. 1, the presence of the cut section 125 does not hinder the vibration of the tuning-fork arms 121 and 122.

The area which is actually fixed when the tuning-fork-type crystal vibrating reed 100 is fixed in a package is the fixation area 113 of FIG. 1.

As shown in FIG. 1, since the lower end portion of the cut section 125 is located higher than the fixation area 113 in FIG. 1, the cut section 125 does not exert an influence on the fixation area 113, and thus no adverse influence is exerted on the fixed state of the tuning-fork-type crystal vibrating reed 100 with respect to the package.

As described above, the cut sections 125 provided in the pad section 110 are provided at positions where no adverse influence is exerted on the vibration of the tuning-fork arms 121 and 122 of the tuning-fork-type crystal vibrating reed 100. Furthermore, the cut sections 125 are also provided at positions where no adverse influence is exerted on the fixed state of the tuning-fork-type crystal vibrating reed 100 with respect to the package.

The cut sections 125 are provided on the pad section 110 sides below the positions of the groove sections 123 and 124 of the tuning-fork arms 121 and 122. As a consequence, the cut sections 125 make it difficult for leakage vibration leaking from the groove sections 123 and 124 due to the vibration of the tuning-fork arms 121 and 122 to propagate to the fixation area 113 of the base 110.

Therefore, it becomes difficult for the leakage vibration to propagate to the fixation area 113, and thus energy escape will not likely occur. For the conventional variation of the CI value between vibrating reed elements, the standard deviation is 10 KΩ or more. However, in this embodiment, the standard deviation is greatly reduced to 1 KΩ.

The tuning-fork-type crystal vibrating reed 100 according to this embodiment is constructed as described above. The steps of forming the insulation films 121c and 122c in the insulation film formation section 121d (see FIG. 1) of the tuning-fork arms 121 and 122 of the tuning-fork-type crystal vibrating reed 100 will be described below in detail.

More specifically, the portion of the tuning-fork-type crystal vibrating reed 100 shown in FIG. 1 where the groove section 123 of the insulation film formation section 121d of the tuning-fork arm 121 is formed will be described using a sectional view.

Figure 3:
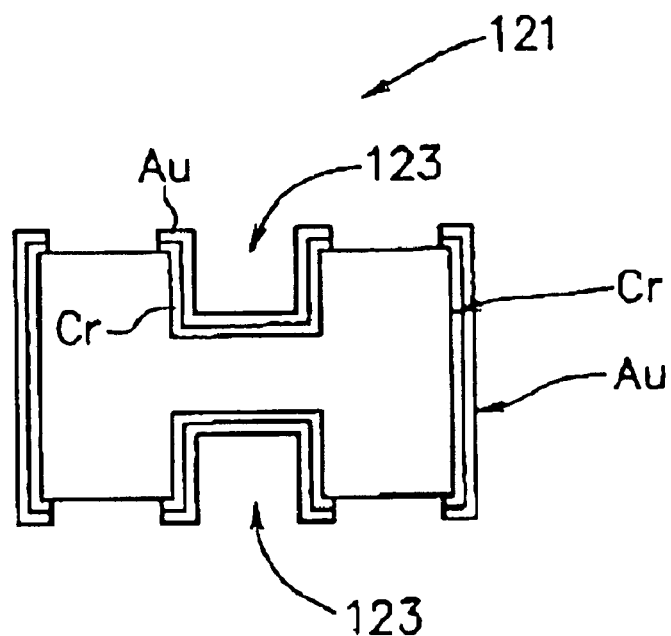
FIG. 3 is an illustration of a step of forming an insulation film in the tuning-fork-type crystal vibrating reed in FIG. 1.

First, as shown in FIG. 3, the groove section 123 is formed on the first or obverse surface and the second or rear surface of the tuning-fork arm 121, respectively. Then, Cr is formed in this groove section 123 at a thickness of, for example, 300 to 1000 μm.

Au is deposited on this Cr at a thickness of 500 to 1000 μm. Similarly, Cr and Au are deposited on the side surface of the groove section 123.

An Au film of a specific portion within the Cr and Au which are deposited in this manner is peeled off. This peeling-off is performed using, for example, a photolithographic technology.

That is, regarding the portions corresponding to the pad electrode section 112, the frequency adjustment electrode sections 121a, etc., of FIG. 1, the Au film is not peeled off, and thus these are formed as the pad electrode section 112 and the frequency adjustment electrode sections 121a having an Au film.

Figure 4:
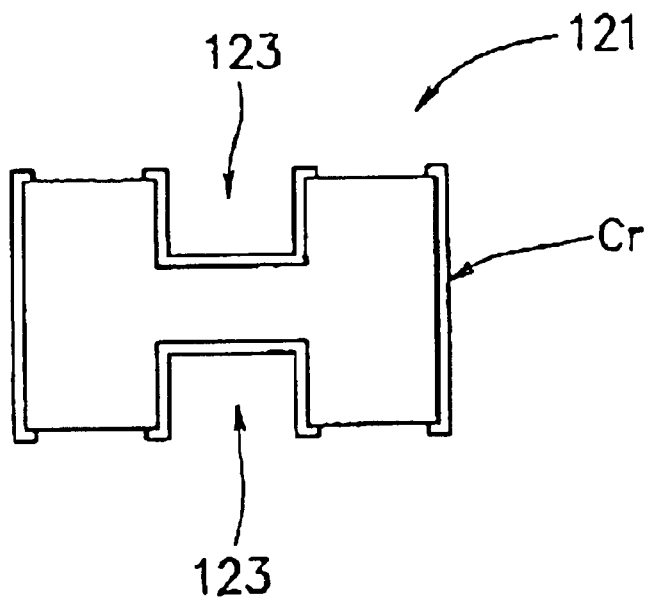
FIG. 4 is an illustration of another step of forming an insulation film in the tuning-fork-type crystal vibrating reed in FIG. 1.

On the other hand, for the portion of the tuning-fork arm 121 having the grooved portion 123a of the insulation film formation section 121d of FIG. 1, the Au film on the surface is peeled off as shown in FIG. 4.

Figure 5:
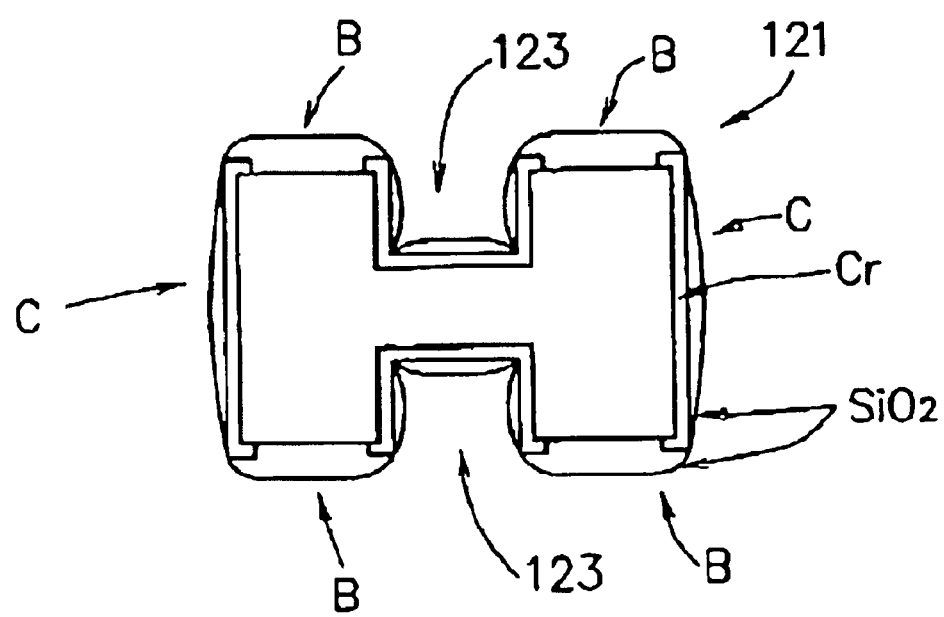
FIG. 5 is an illustration of another step of forming an insulation film in the tuning-fork-type crystal vibrating reed in FIG. 1.

Next, SiO$_2$ which is an insulation film is formed by sputtering as shown in FIG. 5.

The film thickness of the SiO$_2$ on the top surface and the under side, indicated by the arrow B in FIG. 5, of the tuning-fork arm 121 at this time is formed relatively thick to such a degree of, for example, 2000 μm.

However, on the side surface and the inside of the groove section 123, indicated by the arrow C in FIG. 5, the SiO$_2$ film is formed thinner in comparison with this 2000 μm. For example, the film thickness on the side surface is formed to be 1000 μm, and 500 to 1000 μm at the inside of the groove section 123.

Such film deposition is performed with a sputtering apparatus. It is preferable that the top surface and the under side as shown in FIG. 5 be film-deposited as thick as possible and the side surface and the groove section 123 be film-deposited as thin as possible.

After the insulation film is formed as shown in FIG. 5, etching of SiO$_2$ is performed. First, examples of etching liquids include an etching liquid in which, for example, hydrofluoric acid and ammonium nitride are mixed and the concentration is adjusted with water, and a potassium hydroxide.

Figure 6:
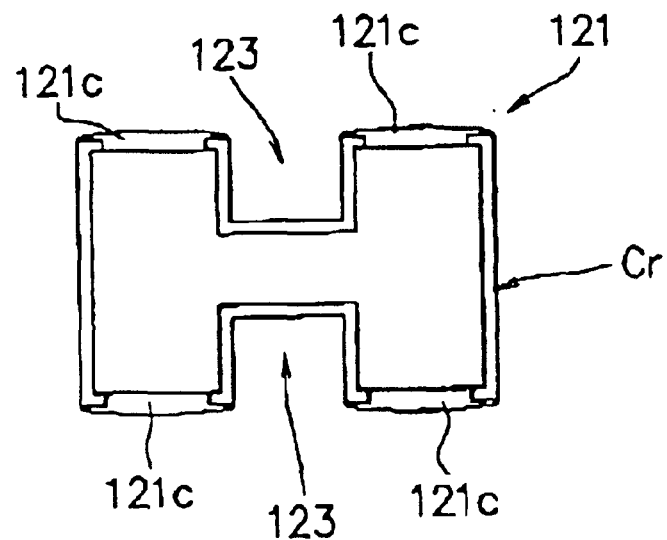
FIG. 6 is an illustration of another step of forming an insulation film in the tuning-fork-type crystal vibrating reed in FIG. 1.

When etching is performed using such an etching liquid, the SiO$_2$ film deposited relatively thin on the side surface (film thickness 1000 μm) of the tuning-fork arm 121 and in the groove section 123 (film thickness 500 to 1000 μm) is removed. If the etching is terminated at this point in time, the SiO$_2$ film of the top surface and the under side (FIG. 5, the arrow B), which is formed relatively thick, remains, and the insulation film 121c is formed as shown in FIG. 6.

Furthermore, since it is possible not to form the SiO$_2$ film on the side surface of the tuning-fork arm 121 and the groove section 123, even if the insulation film 121c is formed, there is no risk that the CI value increases.

In addition, since the insulation film of the side surface of the tuning-fork arm 121 and the groove section 123 can be easily removed by etching, it is possible to prevent the manufacturing costs from increasing.

Although in this embodiment, a case is described in which the insulation film of the side surface of the tuning-fork arm 121 and the groove section 123 is removed by etching, the insulation film may be left on the bottom of this groove section 123.

Figure 7:
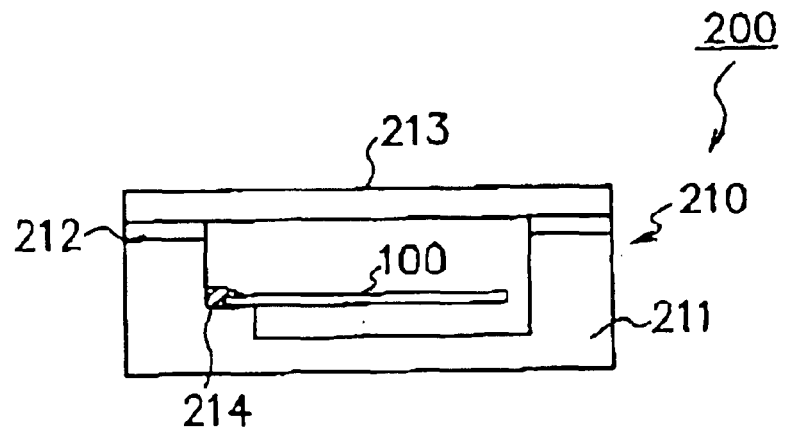
FIG. 7 is a schematic sectional view showing the construction of a ceramic-packaged tuning-fork-type vibrator according to a second embodiment of the present invention.

FIG. 7 shows a ceramic-packaged tuning-fork-type vibrator 200 according to a second embodiment of the present invention.

This ceramic-packaged tuning-fork-type vibrator 200 uses the tuning-fork-type crystal vibrating reed 100 of the above-described first embodiment. Accordingly, the same reference numerals are used for the construction, the operation, etc., of the tuning-fork-type crystal vibrating reed 100, and description thereof are omitted.

FIG. 7 is a schematic sectional view showing the construction of the ceramic-packaged tuning-fork-type vibrator 200. As shown in FIG. 7, the ceramic-packaged tuning-fork-type vibrator 200 has a box-shaped package 210 having a space therein.

This package 210 comprises a base 211 on the bottom thereof. This base 211 is formed from, for example, ceramic such as alumina.

A sealing section 212 is provided on the base 211, with the sealing section 212 being formed from the same material as that of the base 211. Furthermore, a lid member 213 is placed on the upper end portion of this sealing section 212, and the base 211, the sealing section 212, and the lid member 213 form a hollow box.

An electrode 214 for the package side is provided on the base 211 of the package 210 formed in this manner. A fixation area 113 of the base 110 of the tuning-fork-type crystal vibrating reed 100 is fixed onto the electrode 214 for the package side via a conductive bonding agent, etc.

Since this tuning-fork-type crystal vibrating reed 100 is formed as shown in FIG. 1, the CI value of the fundamental wave is minimized, and a vibration failure due to a short-circuit, etc., will not likely occur. Therefore, the ceramic-packaged tuning-fork-type vibrator 200 incorporating this vibrating reed also becomes a small, high-performance vibrator in which the CI value is low and vibration failure will not likely occur.

Figure 8:
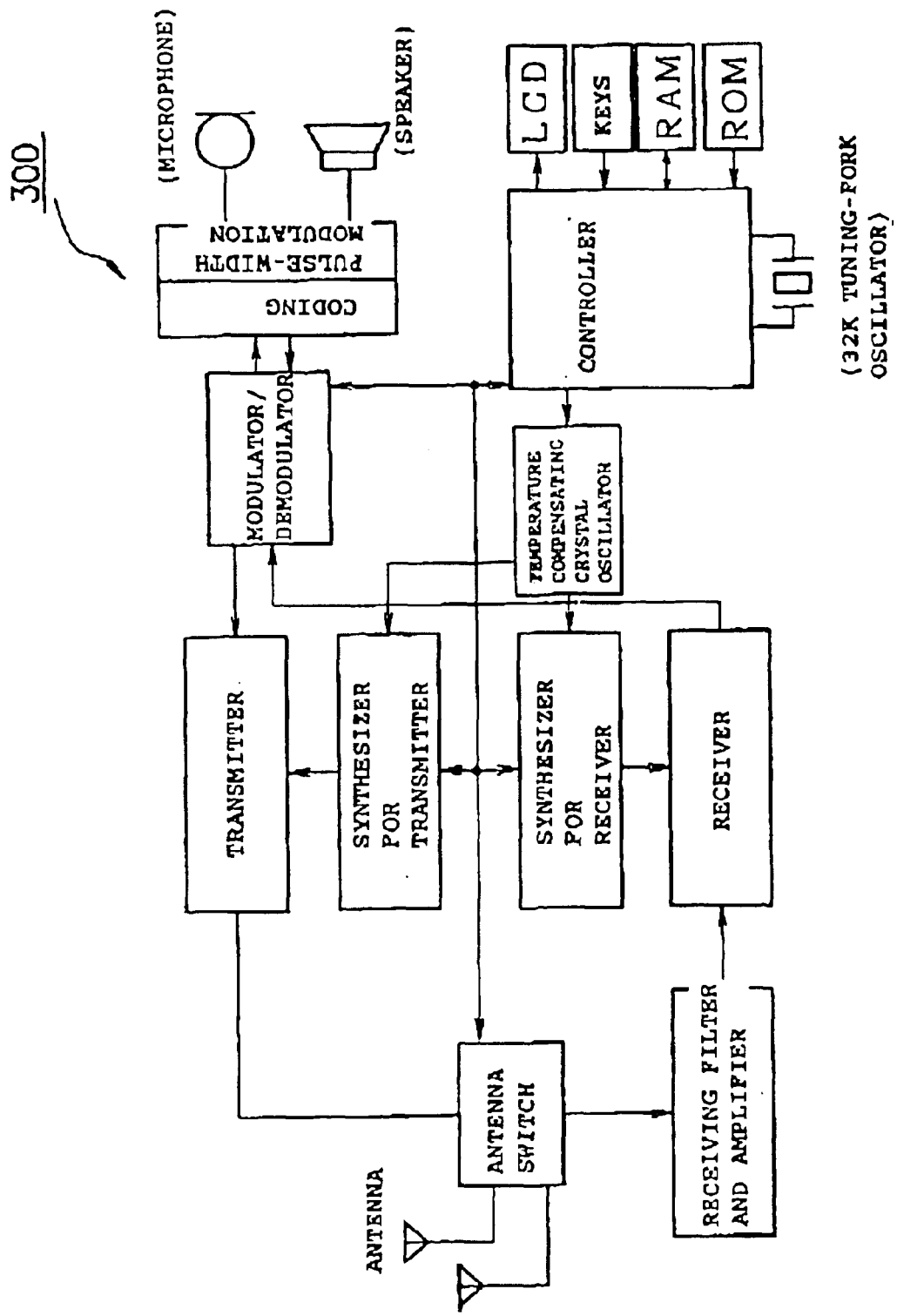
FIG. 8 is a schematic view showing the circuit blocks of a portable digital phone according to a third embodiment of the present invention.

FIG. 8 is a schematic view showing a digital portable phone 300 which is an electronic device according to a third embodiment of the present invention.

This digital portable phone 300 uses the ceramic-packaged tuning-fork-type vibrator 200 according to the second embodiment and the tuning-fork-type crystal vibrating reed 100.

Accordingly, the same reference numerals are used for the construction, the operation, etc., of the ceramic-packaged tuning-fork-type vibrator 200 and the tuning-fork-type crystal vibrating reed 100, and descriptions thereof are omitted.

FIG. 8 shows the circuit blocks of the digital portable phone 300. As shown in FIG. 8, in a case where transmission is performed by the digital portable phone 300, when the user inputs his/her voice into a microphone, the signal passes through pulse-width modulation/coding blocks, modulator/demodulator blocks, a transmitter, and an antenna switch, and is transmitted from an antenna.

On the other hand, a signal transmitted from the telephone of another person is received by the antenna, passes through the antenna switch and the receiving filter, and is input to the modulator/demodulator blocks from the receiver. Then, the modulated or demodulated signal passes through the pulse-width modulation/coding blocks and is output from the speaker as sound.

A controller for controlling the antenna switch, the modulator/demodulator blocks, etc., among the above is provided.

There is a demand for this controller to have a high precision because it controls, in addition to the above, an LCD which is a display section, the keys which are a section for inputting numbers or the like, a RAM, a ROM, etc. There is also a demand for the digital portable phone 300 to become smaller.

As a vibrator meeting such demands, the above-described ceramic-packaged tuning-fork-type vibrator 200 is used.

Since this ceramic-packaged tuning-fork-type vibrator 200 has the tuning-fork-type crystal vibrating reed 100 shown in FIG. 1, the ceramic-packaged tuning-fork-type vibrator 200 becomes a vibrator having a high precision in which the CI value is low and vibration failure will not likely occur. Therefore, the digital portable phone 300 incorporating this ceramic-packaged tuning-fork-type vibrator 200 becomes also a high-precision digital portable phone having a vibrating reed in which the CI value is low and vibration failure will not likely occur.

Figure 9:
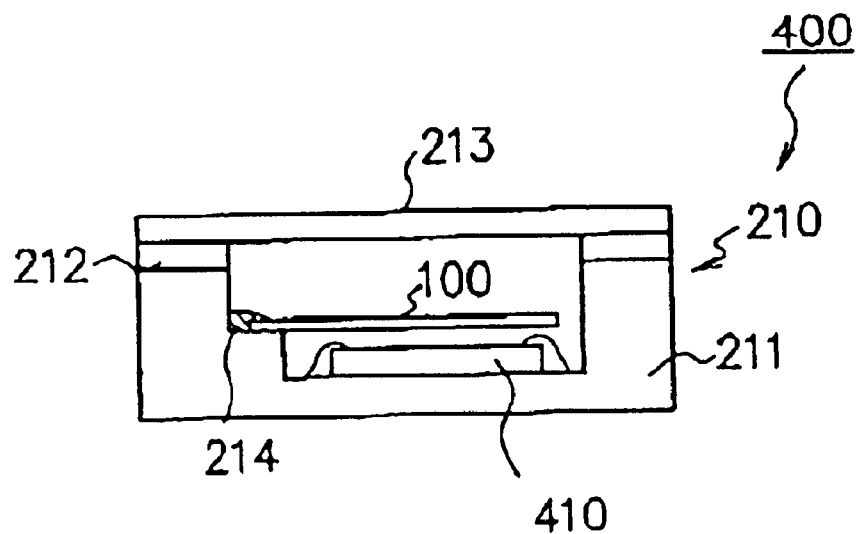
FIG. 9 is a schematic sectional view showing the construction of a tuning-fork crystal oscillator according to a fourth embodiment of the present invention.

FIG. 9 shows a tuning-fork crystal oscillator 400 which is an oscillator according to a fourth embodiment of the present invention.

The construction of this digital tuning-fork crystal oscillator 400 is similar in many portions to the ceramic-packaged tuning-fork-type vibrator 200 of the above-described second embodiment. Accordingly, the same reference numerals are used for the construction, the operation, etc., of the ceramic-packaged tuning-fork-type vibrator 200 and the tuning-fork-type crystal vibrating reed 100, and description thereof are omitted.

Figure 10:
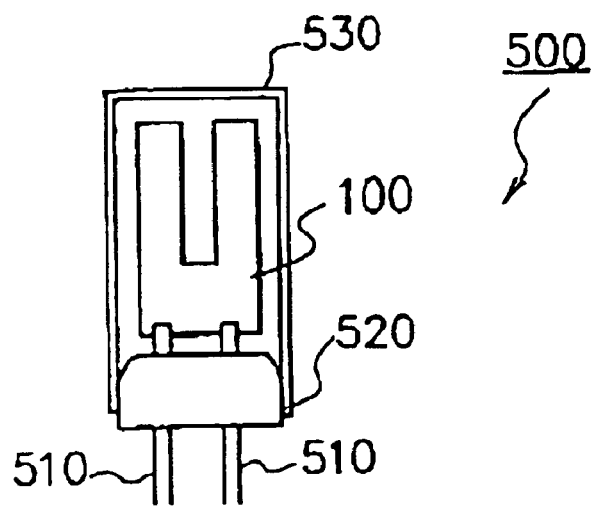
FIG. 10 is a schematic sectional view showing the construction of a cylinder-type tuning-fork vibrator according to a fifth embodiment of the present invention.
Figure 11:
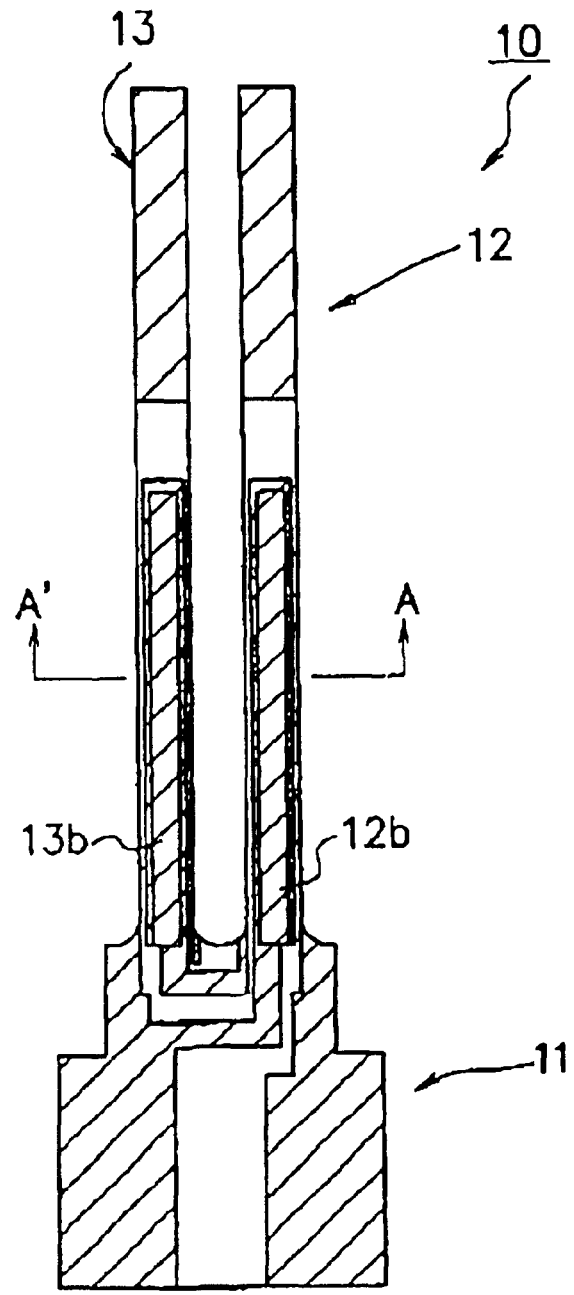
FIG. 11 is a schematic view showing a conventional tuning-fork-type crystal vibrating reed.
Figure 12:
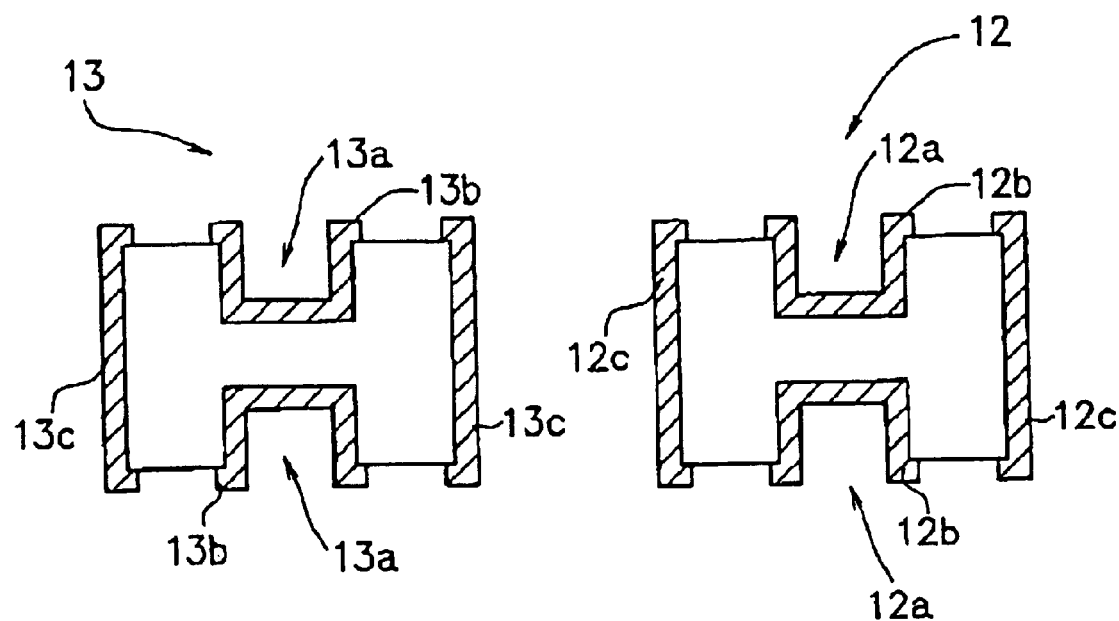
FIG. 12 is a schematic sectional view along the line A–A' in FIG. 11.

The tuning-fork-type crystal oscillator 400 shown in FIG. 9 is formed in such a manner that an integrated circuit 410 is arranged below the tuning-fork-type crystal vibrating reed 100 of the ceramic-packaged tuning-fork-type vibrator 200 shown in FIG. 9 and on the base 211, as shown in FIG. 10.

More specifically, in the tuning-fork crystal oscillator 400, when the tuning-fork-type crystal vibrating reed 100 arranged therein vibrates, the vibration is input to the integrated circuit 410, and thereafter, as a result of extracting a predetermined frequency signal, the tuning-fork crystal oscillator 400 functions as an oscillator.

That is, since the tuning-fork-type crystal vibrating reed 100 housed in the tuning-fork crystal oscillator 400 is formed as shown in FIG. 1, the tuning-fork-type crystal vibrating reed 100 becomes a vibrating reed in which the CI value is low and vibration failure will not likely occur. Therefore, the tuning-fork crystal oscillator 400 incorporating this vibrating reed becomes also a high-performance oscillator.

FIG. 10 shows a cylinder-type tuning-fork vibrator 500 according to a fifth embodiment of the present invention.

This cylinder-type tuning-fork vibrator 500 uses the tuning-fork-type crystal vibrating reed 100 according to the first embodiment. Accordingly, the same reference numerals are used for the construction, the operation, etc., of the tuning-fork-type crystal vibrating reed 100, and description thereof are omitted.

FIG. 10 is a schematic view showing the construction of the cylinder-type tuning-fork vibrator 500.

As shown in FIG. 10, the cylinder-type tuning-fork vibrator 500 has a metal cap 530 for housing the tuning-fork-type crystal vibrating reed 100 therein. This cap 530 is press-fitted into a stem 520 so that the inside thereof is maintained in a vacuum state.

Furthermore, two leads 510 for holding the tuning-fork-type crystal vibrating reed 100 in substantially an H shape, housed in the cap 530 are arranged.

When an electric current is externally applied to such a cylinder-type tuning-fork vibrator 500, the tuning-fork arms 121 and 122 of the tuning-fork-type crystal vibrating reed 100 vibrate, and it functions as a vibrator.

At this time, since the tuning-fork-type crystal vibrating reed 100 is formed as shown in FIG. 1, it becomes a vibrating reed in which the CI value is low and vibration failure will not likely occur. The cylinder-type tuning-fork vibrator 500 incorporating this vibrating reed also becomes a high-performance vibrator.

Although in each of the above-described embodiments, a description is given by using a tuning-fork-type crystal vibrator of 32.738 kHz as an example, it is clear that a tuning-fork-type crystal vibrator of 15 to 155 kHz can also be used.

It is clear that the tuning-fork-type crystal vibrating reed 100 according to the above-described embodiments can be used for not only the above-described examples, but also for other electronic devices, mobile information terminals, built-in-clock devices such as televisions, video devices, radio cassette recorders, or personal computers, and clocks.

In addition the present invention is not limited to the above-described embodiments, and various modifications are possible within the scope of the claims. A part of the construction of the above-described embodiments can be omitted, or can be changed to a desired combination which is not described in the foregoing.

The entire disclosure of Japanese Patent Application No. 2001-059048, filed Mar. 2, 2001, is incorporated by reference herein.

What is claimed is:

1. A vibrating reed comprising:
   a base;
   a vibration arm section formed so as to protrude from said base, the vibration arm section having a grooved portion formed in one of an obverse surface and a rear surface of said vibration arm section;
   a side portion spaced apart from said grooved portion, and a connecting surface extending from said side portion to said grooved portion; and
   a groove electrode portion and a side electrode portion formed on said grooved portion and said side portion of said vibration arm section, respectively, at least part of one of said groove electrode portion and said side electrode portion extending partially over said connecting surface of said side portion;
   wherein a short-circuit prevention section is formed between said groove electrode portion and said side electrode portion at said connecting surface.

2. A vibrating reed according to claim 1, wherein said groove electrode portion and said side electrode portion further comprise excitation electrodes.

3. A vibrating reed according to claim 1, wherein said short-circuit prevention section further comprises an insulation film extending over at least one of said groove electrode portion and said side electrode portion at said upper surface of said side portion.

4. A vibrating reed according to claim 3, wherein said insulation film further comprises an etched insulating film.

5. A vibrating reed according to claim 1, wherein a cut section is formed in said base.

6. A vibrating reed according to claim 5, wherein said base is provided with a fixation area for fixing the vibrating reed, and said cut section is provided in the base between the fixation area and said vibration arm section.

7. A vibrating reed according to claim 1, wherein said vibrating reed further comprises a tuning-fork-type vibrating reed formed from a crystal which oscillates between approximately 30 kHz and approximately 40 kHz.

8. A vibrator having a vibrating reed housed in a package, said vibrating reed comprising:

a base;

a vibration arm section formed so as to protrude from said base, the vibration arm section having a grooved portion formed in one of an obverse surface and a rear surface of said vibration arm section, a side portion extending apart from said grooved portion, and a connecting surface extending from said side portion to said grooved portion; and a groove electrode portion and a side electrode portion being formed on said grooved portion and said side portion of said vibration arm section, respectively, at least part of one of said groove electrode portion and said side electrode portion extending partially over said connecting surface of said side portion;

wherein a short-circuit prevention section is formed between said groove electrode portion and said side electrode portion of said vibrating reed at said connecting surface.

9. A vibrator according to claim 8, wherein said groove electrode portion and said side electrode portion of said vibrating reed are excitation electrodes.

10. A vibrator according to claim 8, wherein said short-circuit prevention section of said vibrating reed further comprises an insulation film.

11. A vibrator according to claim 10, wherein said insulation film of said vibrating reed further comprises an etched insulation film.

12. A vibrator according to claim 8, wherein a cut section is formed in said base of said vibrating reed.

13. A vibrator according to claim 12, wherein a fixation area for fixing the vibrating reed is provided in said cut section of said vibrating reed, and said cut section is provided in the base between the fixation area and said vibration arm section.

14. A vibrator according to claim 8, wherein said vibrating reed is formed by a crystal which oscillates between approximately 30 kHz and approximately 40 kHz and comprises a tuning-fork-type vibrating reed.

15. A vibrator according to claim 8, wherein said package is formed in a box shape.

16. A vibrator according to claim 8, wherein said package is formed in a cylinder shape.

17. An oscillator having a vibrating reed and an integrated circuit housed in a package, said vibrating reed comprising:

a base;

a vibration arm section formed so as to protrude from said base, the vibration arm section having a grooved portion formed in one of an obverse surface and a rear surface of said vibration arm section, a side portion spaced apart from said grooved portion, and a connecting surface extending from said side portion to said grooved portion; and a groove electrode portion and a side electrode portion being formed on said grooved portion and said side portion of said vibration arm section, respectively, at least part of one of said groove electrode portion and said side electrode portion extending partially over said connecting surface of said side portion;

wherein a short-circuit prevention section is formed between said groove electrode portion and said side electrode portion of said vibrating reed at said connecting surface.

18. An electronic device using a vibrator which is connected to a control section, said vibrator having a vibrating reed housed in a package, said vibrating reed comprising:

a base;

a vibration arm section formed so as to protrude from said base, the vibration arm section having a grooved portion formed in one of an obverse surface and a rear surface of said vibration arm section, a side portion spaced apart from said grooved portion, and a connecting surface extending from said side portion to said grooved portion; and a groove electrode portion and a side electrode portion formed on said grooved portion and said side portion of said vibration arm section, respectively, at least part of one of said groove electrode portion and said side electrode portion extending partially over said connecting surface of said side portion;

wherein a short-circuit prevention section is formed between said groove electrode portion and said side electrode portion of said vibrating reed at said connecting surface.

* * * * *